(12) United States Patent
Craft, Jr.

(10) Patent No.: US 6,184,474 B1
(45) Date of Patent: Feb. 6, 2001

(54) DEVICE FOR MANAGING WIRE AND CABLE FOR ELECTRONIC SYSTEMS

(75) Inventor: Thomas F. Craft, Jr., Hackettstown, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/177,764

(22) Filed: Oct. 23, 1998

(51) Int. Cl.[7] ....................................... H01B 7/08
(52) U.S. Cl. ........................ 174/135; 174/72 A; 174/96
(58) Field of Search ........................ 174/60, 96, 97, 174/98, 135, 40 CC, 72 A, 72 C, 72 TR, 84 R; 40/316

(56) References Cited

U.S. PATENT DOCUMENTS

| | | | |
|---|---|---|---|
| 4,500,151 | * 2/1985 | Ayers | 174/77 R |
| 4,640,984 | * 2/1987 | Kalbfeld | 174/135 |
| 5,569,882 | * 10/1996 | Yokoyama et al. | 174/76 |
| 5,929,386 | * 7/1999 | Hornick | 174/135 |
| 5,941,729 | * 8/1999 | Sri-Jayantha | 439/39 |
| 6,007,368 | * 12/1999 | Lorenz et al. | 439/418 |

\* cited by examiner

*Primary Examiner*—Kristine Kincaid
*Assistant Examiner*—Adolfo Nino
(74) *Attorney, Agent, or Firm*—Darby & Darby

(57) ABSTRACT

A device for holding wires/fibers is provided in which a block of resilient material is formed with grooves for receiving cable and wires/fibers. In a particular illustrative embodiment of the invention, a single groove for receiving a cable is connected to multiple grooves for receiving wires/fibers that are contained within the cable. The grooves also preferably are open at one end to the exterior of the unit of material so that the cable and wires/fibers extend to the desired points of attachment.

15 Claims, 2 Drawing Sheets

DEVICE FOR MANAGING WIRE AND CABLE FOR ELECTRONIC SYSTEMS

FIELD OF THE INVENTION

The present invention relates generally to devices for holding and maintaining the position of electronic components. More specifically, the present invention relates to a device for holding wires/fibers and cables in electronic systems.

BACKGROUND OF THE INVENTION

In past and present systems, wire and/or fiber management and handling is a major customer concern. Products that require multiple different personnel for installing, servicing, and maintaining electronics with large amounts of wire or fiber handling requires some method of managing that wire. Without a sufficient wire management device, after time, these electronic systems become a tangled mass of wires or fibers that are difficult to trace and maintain. This increases the cost to the customer due to long service and maintenance times with a greatly increased probability of error.

One example of this problem is in systems that use large bundled cables that include a large number of wires or fibers within each cable, such as in telephone network systems. A cable having dozens of telephone wire pairs may travel into a junction zone, but only one or two of the wire pairs needs to be split off at that junction. The remaining pairs within the cable remains unbroken and travel through the junction. At that junction point, a portion of the outer cover of the cable is stripped away to expose the wires within. The wires are then unbundled in some fashion to expose the desired wires. These wires are then cut and pulled out, leaving exposed the remaining unbundled wires within the cable. Over time, these exposed wires can become tangled so that further attempts to reach a desired wire will become difficult.

Another similar example of this problem occurs with fiber-optic systems. As is known, multiple fibers are bundled into cables. At any particular junction point, perhaps only one fiber will need to be split off for connection to network equipment, such as WDM(s), splitters, and/or splices. As with wire cable, it is necessary to remove the outer insulation from the cable to expose a portion of the fiber-optics in order to gain access to the single desired fiber. In typical installations, the fiber-optic cable is wrapped once around two drums that are spaced apart with the exposed portions of the fibers extending between the drums. After the desired fiber has been cut and attached to the desired junction equipment, the remaining fibers are left to span the distance between the drums, but remain exposed. These exposed fibers are not held particularly taught, so that again, over time there is a likelihood that these fibers will become tangled either with themselves or fibers from an adjacent cable, making all future maintenance much more difficult.

Previous methods for managing wire and cable consist of using various cable clips, wire ties, and the like. However, these devices merely catch a single wire, group of wires, or cable at a single point. Thus, they do not capture the wire and hold it in any way that significantly avoids tangling. Further, the devices can actually aid in tangling of the wires by having them exposed to being twisted, crimped, nick, cut and the like.

SUMMARY OF THE INVENTION

It is an object of the present invention to provide a device for holding selected wires/fibers in systems that use cables having multiple wires/fibers.

It is another object of the present invention to provide a device for holding wires/fibers that is easy to use and install, and that maintains the position of the wires/fibers.

It is a further object of the present invention to provide a device for holding wires/fibers in which the configuration of wires/fibers being held can be easily changed to accommodate different configurations.

It is still another object of the present invention to provide a device for holding wires/fibers that is simple and cost-efficient to manufacture, use, and maintain.

In accordance with an exemplary embodiment of the present invention, a device for holding wires/fibers is provided in which a unit of resilient material is formed with grooves for receiving a cable and wires/fibers. In a particular illustrative embodiment of the invention, a single groove for receiving cable is connected to multiple grooves for receiving wires/fibers that are contained within the cable. The grooves also preferably are open at one end to the exterior of the unit of material so that the cable and wires/fibers extend to the desired points of attachment.

BRIEF DESCRIPTION OF THE DRAWINGS

The above mentioned and other objects and advantages of the present invention will become apparent to those skilled in the art upon reading the following detailed description of the preferred embodiments in conjunction with a review of the appended drawings, in which.

DETAILED DESCRIPTION OF THE PREFERRED EMBODIMENTS

Figure 1:
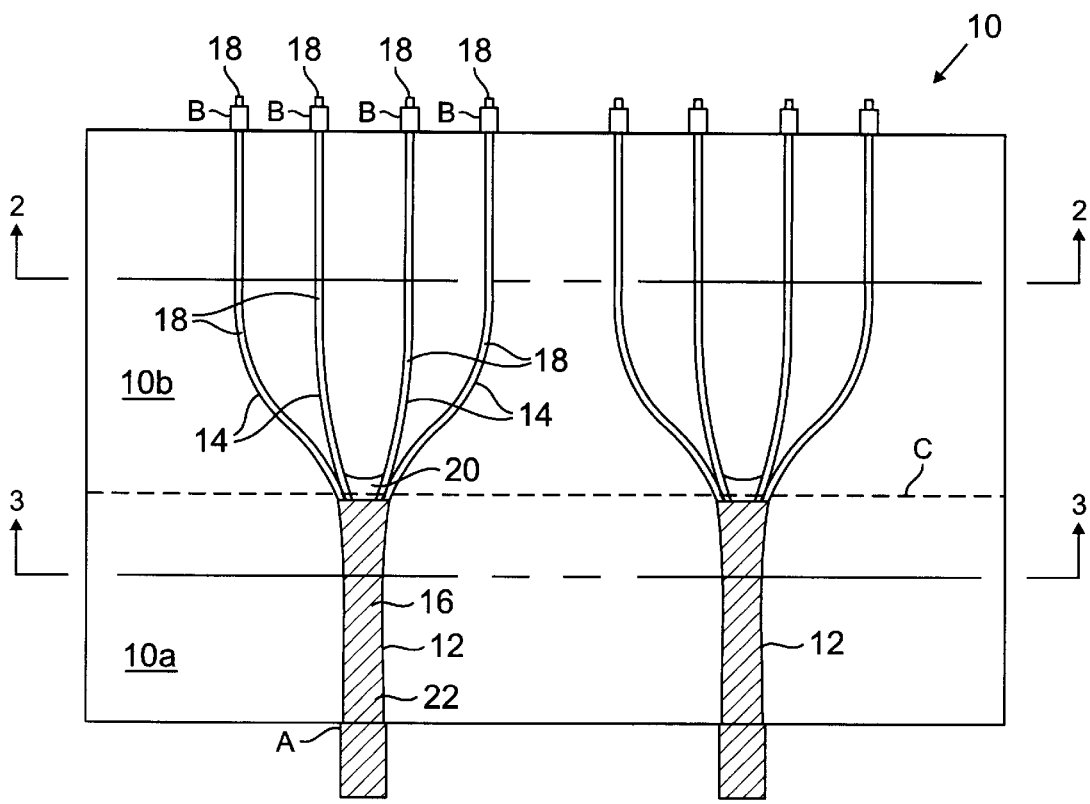
FIG. 1 is a top view of a preferred embodiment of the present invention.

Referring now to FIG. 1, a preferred embodiment of the present invention is shown. In summary, the present invention includes a block of material which holds cables having multiple wires/fibers, and also individually holds the wires/fibers to maintain their position and prevent the wires/fibers from becoming damaged and tangled. In the preferred embodiment, the unit is a generally flat block 10 of resilient material having a number of grooves 12, 14 formed in it for receiving the cables 16 and wires/fibers 18.

As can be seen in FIG. 1, a single groove 12 is open to the exterior of the block 10 (at A) for receiving a cable 16. Several smaller grooves 14 are connected to the larger groove 12 through a transition area 20. The cable 16 is inserted into the larger groove 12 so that the point at which the outer insulation 22 of the cable 16 ends approximately at beginning of the transition area 20. The wires/fibers 18 that extend from the cable 16 are then pushed into the smaller grooves 14 and ultimately extend out of the flat block 10 (at B). The smaller grooves 14 also preferably are open to the exterior of the block 10 (at B) so that the wires/fibers 18 may be connected to the desired components.

Figure 2:
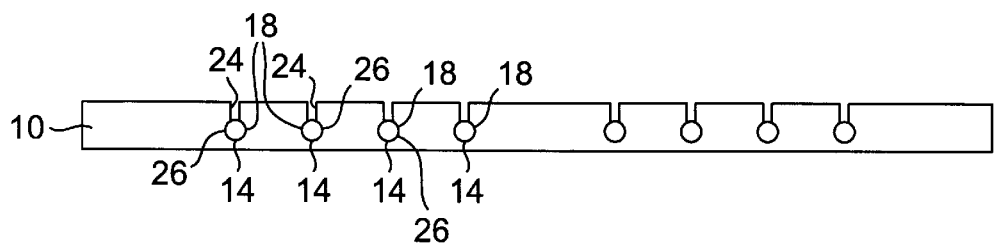
FIG. 2 is a cross-sectional view taken along the line 2—2 of FIG. 1.
Figure 3:
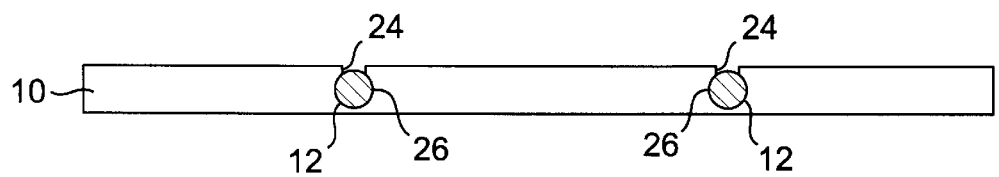
FIG. 3 is a cross-sectional view taken along the line 3—3 of FIG. 1.

Referring now to FIGS. 2 and 3, it can be seen that the smaller and larger grooves 12, 14 have a narrowed neck area 24 and then a larger receiving area 26 in which the cable 16 and wires/fibers 18 rest when inserted into the block 10. These neck and receiving areas 24,26 prevent the cables 16 and wires/fibers 18 from detaching from the block 10 accidentally. The block 10 is preferably formed of a resilient material, such as a closed cell foam rubber pad, so that when the cables 16 and wire/fibers 18 are inserted into the grooves 12, 14, the neck area 24 of the grooves 12, 14 will temporarily spread to allow for the insertion and then rebound to their narrowed position to retain the cables 16 and wires/fibers 18 within the block 10. Because the grooves 12, 14 are formed with the neck areas 24 to maintain the cables and wires/fibers, the blocks may be mounted in any orientation, such as horizontal, vertical, or upside down, to accommodate the working environment of the block 10.

The overall shape of the block 10 is generally not important. However, the block 10 should have at least one dimension that is long enough so that grooves 12, 14 of significant length can be formed in the block 10 to provide not only an attachment point for the wires/fibers, but also directional guidance and protection from crimping, tangling and the like. It is also not critical to the invention how the grooves 12, 14 are formed in the block 10. The grooves 12, 14 may be formed in the block 10 when the block is first molded as a closed cell foam. Alternatively, the grooves 12, 14 can be cut into the block 10 after it has been formed. Other manufacturing methods will be apparent to those skilled in the art. To place the block 10 in a working area, it is preferred that the back side of the block (the side opposite the side with the grooves 12, 14) have an adhesive for securing the block to a nearby surface, such as a wall or a surface of a housing.

In an alternate embodiment of the invention, the function provided by the single block shown in FIG. 1 can be provided by two or more blocks 10. In that embodiment, the block 10 would be split along the line at C, forming two blocks 10a, 10b. One block 10a is then formed with a single larger groove to accept a single cable. Another block 10b is then formed with multiple smaller grooves for receiving wires/fibers. These two blocks could then be placed adjacent to each other to essentially create a single block such as that found in FIG. 1. To facilitate the adjacent placement of the two blocks, at least one end of the grooves in the separate blocks is preferably widened to form a transition area between the larger groove and the smaller grooves. In this embodiment, many blocks may be formed for various cable and wire/fiber sizes and the number of wires/fibers within the cable, which could then be combined on demand to meet any cable configuration that is encountered. For purposes of this specification, the term wire includes any type of electrical wire or fiber-optic that are typically bundled in groups within a cable.

Figure 4:
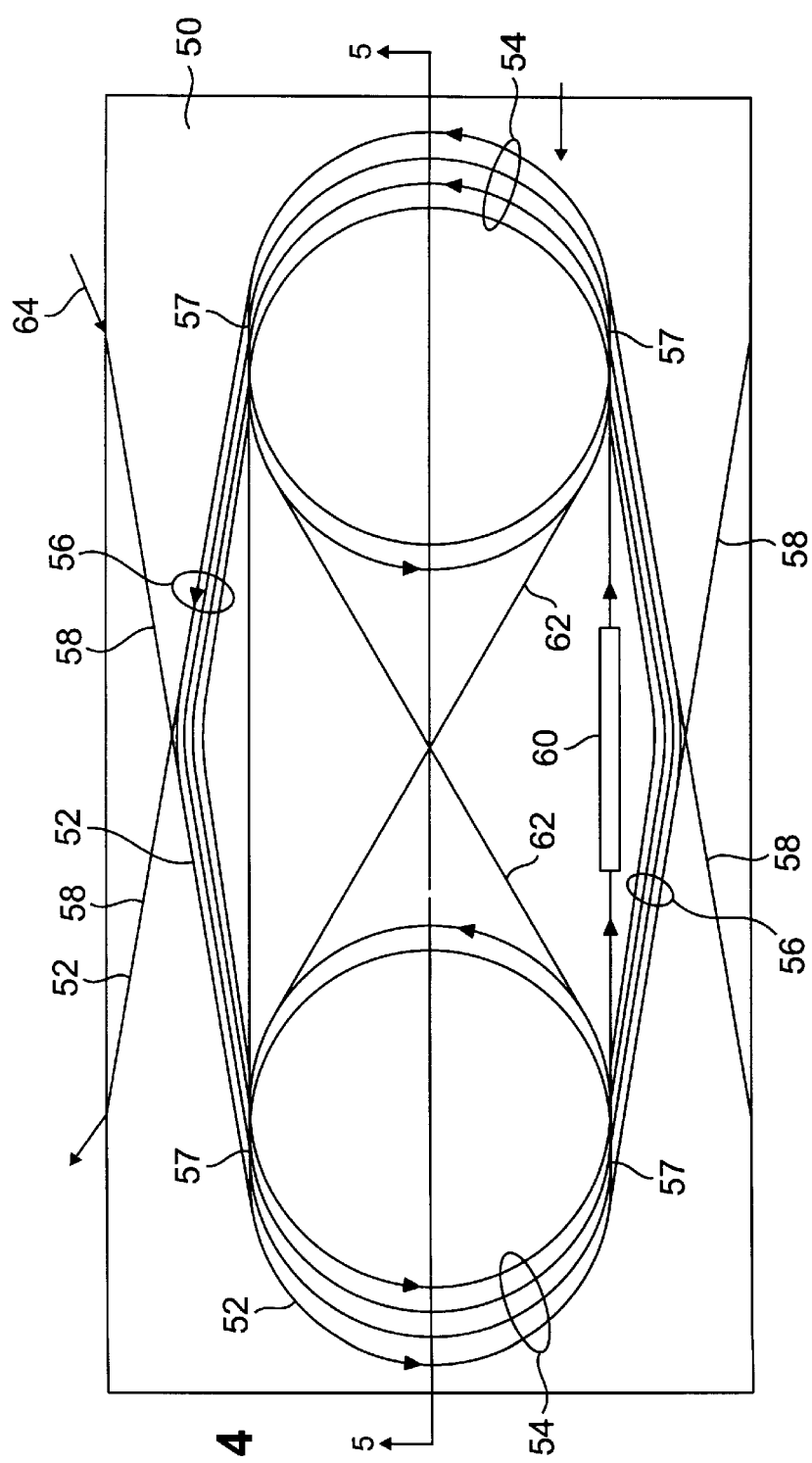
FIG. 4 is a top view of an alternate embodiment of the present invention.
Figure 5:
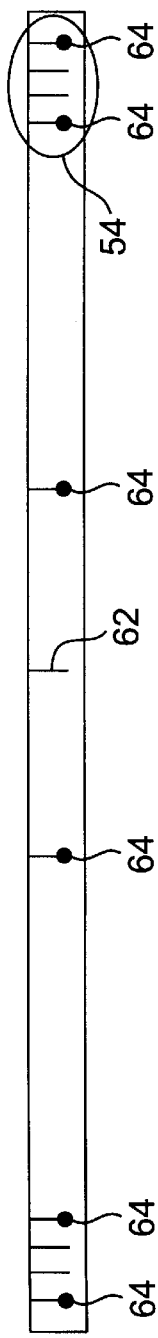
FIG. 5 is a cross-sectional view taken along the line 5—5 of FIG. 4.

Referring now to FIGS. 4 and 5, an alternate embodiment of the present invention is shown which is particularly useful for holding fiber-optic cable. When a single fiber is severed and removed from a bundle of fibers within a cable, it is then spliced to another length of fiber that is attached to the equipment. This results in a long piece of fiber that can easily be tangled, either with itself or the other fibers in the bundle. The block 50 includes multiple grooves 52 for holding a fiber. The grooves follow various curves to allow slack in the fiber to be held on the block 50 while preventing the fiber from being curved or bent with a radius of curvature smaller than that recommended for the proper transmission of signals through the fiber or to prevent breakage of the fiber. The curved grooves 52 preferably follow a racecourse, dromic shape with turns (at 54) and relative straight portions (at 56). At the transition areas (at 57) between the straight sections and turns, a fiber may be placed from any straight portion into any of the turns. This allows the user to place the fiber into the turn or straight section that best allows the block 50 to hold all of the slack in the fiber. It is also contemplated by the present invention that the fiber might be wrapped several times between the turn sections, using either the straight sections 56 or the connecting grooves 62. Some of the grooves 58 acts as entrance and exit points from the block 50 for the fibers. These grooves 58 are open to the sides of the blocks, to allow the fibers to extend into and out of the block 50. As with the previous embodiments, the block 50 is preferably formed of a closed cell foam and is also preferably formed with an adhesive on the side opposite the grooves, although this is not necessary for the invention.

The block also includes a splice or hardware groove 60, which is connected to a straight portion 56, but is significantly wider to accommodate standard splicing hardware, similar to the wider groove 12 described above for holding cable having outer insulation. Alternatively, the block 50 may be formed without a splice or hardware groove 60. The spliced portion of the fiber and the splicing hardware would then rest on top of the surface of the block 50, while the fiber extending out of the splicing hardware on both sides would be inserted into and held by the block 50.

The block 50 is shown with a fiber 64 inserted into some of the grooves. The arrowheads on the grooves indicate those grooves that contain the fiber. As seen in FIG. 5, which is a cross-section taken along the line 5—5 of FIG. 4, the fiber 64 preferably rests in the bottom of each groove 52, where it is firmly held, similar to the previous embodiments. It can also be seen in FIG. 5 that the fiber is wrapped around each turn area more than once (see arrowheads at D, E, and F, for example) to take up the slack in the fiber and prevent tangling or damage to the fiber.

It can thus be seen that the present invention meets its objects and advantages and provides an improved device for holding cables and wire/fibers in a working environment. It will be apparent to one skilled in the art that minor modifications may be made to the preferred embodiments without departing from the spirit of the invention. It is also to be understood that the foregoing embodiments have been shown and described solely for the purpose of illustration and not for the purpose of limitation, the claims only being limited by the following claims.

What is claimed is:

1. An apparatus to hold a cable and wires from within the cable, comprising:

a block having at least two grooves, a first of said grooves having a first width to receive and hold a cable inserted therein, the second of said grooves having a second width less than said first width to receive and hold a wire inserted therein, said two grooves being connected to each other; and wherein said first and second grooves each include a narrowed neck area having a width less than said first and second widths, respectively.

2. An apparatus as in claim 1, wherein said block has multiple second grooves having said second width and being connected to said first of said grooves.

3. An apparatus as in claim 2, wherein said block is formed of a resilient material.

4. An apparatus as in claim 3, wherein said block is formed of a closed cell foam.

5. An apparatus to receive and hold a cable and wires from within the cable, comprising:

a block having at least two grooves, a first of said grooves having a first width to receive and hold a cable inserted therein, the second of said grooves having a second width less than said first width to receive and hold a wire inserted therein, said two grooves being connected to each other; and wherein said first and second grooves are connected to each other at a transition area and each of said first and second grooves includes a narrowed neck area having a width less than said first and second widths, respectively.

6. An apparatus to hold a cable containing multiple wires, the cable having an outer insulation covering at least a first portion of the wires, the wires also being exposed in a second portion, comprising:

a block having at least two grooves, a first of said grooves having a first width to receive and hold a cable, a second of said grooves having a second width for receiving and holding a wire, said first and second grooves being connected; and wherein said first and second grooves each has a narrowed neck area having a width less than said first and second width, respectively.

7. An apparatus as in claim 6, wherein said second width is less than said first width.

8. An apparatus as in claim 7, wherein said block has multiple second grooves connected to said first groove.

9. An apparatus to hold a cable and a wire from within the cable, comprising:

a first block having a first groove with a first width to receive and hold a cable inserted therein;

a second block having at least one second groove with a second width less than said first width to receive and hold a wire inserted therein; and wherein said first and second grooves each include a narrowed neck area having a width less than said first and second widths, respectively.

10. An apparatus as in claim 9, wherein said first and second blocks are mounted adjacent to each other such that an end of each of said first and second grooves are positioned substantially adjacent to each other.

11. An apparatus as in claim 10, wherein said second block has a plurality of second grooves, an end of each of said second grooves being positioned adjacent to an end of said first groove.

12. An apparatus to hold a fiber-optic cable, comprising:

a block of resilient material having a first groove to receive a fiber-optic cable, said first groove being at least partially curved with a radius of curvature not less than the minimum radius of curvature permitted for transmission of signals through the fiber-optic cable.

13. An apparatus as in claim 12, further comprising a hardware groove connected to said first groove for receiving hardware attached to the fiber-optic cable, said hardware groove being wider than said first groove.

14. An apparatus as in claim 13, further comprising a second groove in said block, said second groove having a different radius of curvature than said first groove, said first and second grooves being connected at at least two points.

15. An apparatus as in claim 14, wherein said first groove extends to a side of said block and is open to said side of said block.

* * * * *